(12) United States Patent
Hastings

(10) Patent No.: US 6,275,074 B1
(45) Date of Patent: Aug. 14, 2001

(54) SYSTEM FOR PROPAGATING A DIGITAL SIGNAL THROUGH A SLEW-RATE LIMITED NODE AND METHOD OF OPERATION

(75) Inventor: Roy A. Hastings, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/225,100

(22) Filed: Jan. 4, 1999

Related U.S. Application Data
(60) Provisional application No. 60/070,608, filed on Jan. 5, 1998.

(51) Int. Cl.[7] .............................. H03K 5/22; H03K 5/153
(52) U.S. Cl. ............................................. 327/74; 327/205
(58) Field of Search .............................. 327/74–76, 170, 327/374–377, 205

(56) References Cited

U.S. PATENT DOCUMENTS

| | | | |
|---|---|---|---|
| 4,352,999 | * 10/1982 | Galpin | 327/78 |
| 4,421,995 | * 12/1983 | Gottschalk | 327/74 |
| 5,097,147 | * 3/1992 | Stuebing et al. | 327/74 |
| 5,278,462 | * 1/1994 | Wilson | 327/74 |
| 5,532,626 | * 7/1996 | Khayat | 327/338 |
| 5,554,948 | * 9/1996 | Hansen et al. | 327/181 |
| 5,717,349 | * 2/1998 | Bortot et al. | 327/62 |
| 5,770,967 | * 6/1998 | Alzati et al. | 327/390 |
| 5,856,751 | * 1/1999 | Gleim et al. | 327/74 |
| 5,949,280 | * 9/1999 | Sasaki | 327/74 |
| 6,100,678 | * 8/2000 | Hobrecht | 323/288 |

\* cited by examiner

*Primary Examiner*—Terry D. Cunningham
*Assistant Examiner*—Long Nguyen
(74) *Attorney, Agent, or Firm*—J. Dennis Moore; W. James Brady, III; Frederick J. Telecky, Jr.

(57) ABSTRACT

A system (10) for propagating a digital signal through a slew-rate limited node (18) includes a signal generator (12) which generates slowly-slewing signal (14). A signal conditioner (16) couples to signal generator (12) at node (18) to receive slowly-slewing signal (14), and produces rapidly-slewing signal (20). Signal conditioner (16) converts signal (14) into signal (20) to reduce the propagation delay from signal generator (12) to load (24) by comparing signal (14) with a low voltage threshold, $V_L$, and a high voltage threshold, $V_H$. Signal conditioner (16) employs memory device (92) to determine whether signal (14) is rising or falling upon crossing either threshold $V_L$ or $V_H$.

20 Claims, 3 Drawing Sheets

SYSTEM FOR PROPAGATING A DIGITAL SIGNAL THROUGH A SLEW-RATE LIMITED NODE AND METHOD OF OPERATION

This application claims priority under 35 USC § 119(e)(1) of provisional application No. 60/070,608 filed Jan. 5, 1998.

TECHNICAL FIELD OF THE INVENTION

This invention relates in general to electronics, and more particularly to a system for propagating a digital signal through a slew-rate limited node and method of operation.

BACKGROUND OF THE INVENTION

Many switch-mode power supplies use older generation controller integrated circuits (ICs) because they are inexpensive. The output circuits of many of these controller ICs have limited power drive capabilities, and, therefore, do not efficiently drive modern power MOSFETs. Typically, the output circuits of these controller ICs are NPN transistors with open collector terminals. To drive a power MOSFET, the controller IC must generate a rail-to-rail output voltage waveform. This can be accomplished by connecting a resistor between the collector terminal of the NPN transistor and a suitable power supply, and by grounding the emitter terminal. However, the resulting NPN transistor with resistive pull-up suffers several drawbacks when used as a gate driver.

In particular, a MOSFET gate terminal exhibits a large non-linear input capacitance. A large total gate charge is required to slew the gate from one supply rail to the other. Large currents are required to transfer this amount of charge quickly enough to obtain the desired switching times for the MOSFET. The NPN transistor with resistive pull-up cannot generate the high currents required to achieve the desired switching times without the use of a prohibitively small pull-up resistor.

One solution connects an external gate driver circuit between the controller IC and the MOSFET to generate the high currents necessary to slew the large gate capacitance quickly. Generally, a gate driver circuit receives a low current signal to drive a highly capacitive load, such as a power MOSFET. The input signal controls the timing and duration of the high voltage/high current signal output to the load.

Internal and external capacitances and resistances, including those associated with the NPN transistor, cause the output voltage waveform generated by the NPN transistor with resistive pull-up to exhibit large rise and fall times. The resistive pull-up connected to the open-collector NPN transistor in older-generation controller ICs causes the output voltage waveform of the controller IC to rise very slowly. The output voltage waveform therefore exhibits an excessively long rise time. The output voltage waveform may also exhibit a long fall time due to other limitations of older-generation controller ICs.

A gate driver can reduce the rise and fall times of the voltage waveform supplied to the power MOSFET, but propagation delays associated with the rise and fall times of the output voltage waveform of the controller IC will still remain. These propagation delays are undesirable consequences of propagating through a node a digital control signal which exhibits large rise and fall times. Since large rise and fall times are associated with small slew rates, such nodes are said to be slew-rate limited.

SUMMARY OF THE INVENTION

In accordance with the teachings of the present invention, a system for reducing the propagation delay of a digital signal through a slew-rate limited node is provided which substantially eliminates or reduces disadvantages and problems associated with prior gate driver systems.

In accordance with one embodiment of the present invention, a system for propagating a digital signal includes a threshold circuit and an output circuit. The threshold circuit includes a comparator circuit that indicates whether an input signal has entered a voltage region, and a memory coupled to the comparator circuit that has a first state if the input signal is rising upon entering the voltage region and a second state if the input signal is falling upon entering the voltage region. The output circuit is coupled to the memory and generates a high output signal when the input signal is within the voltage region and the memory is in the first state. The output circuit generates a low output signal when the input signal is within the voltage region and the memory is in the second state.

Another embodiment of the present invention is a method for propagating a digital signal that includes receiving an input signal and determining whether the input signal is within a voltage region. The method further includes determining a first state if the input signal is rising upon entering the voltage region, and determining a second state if the input signal is falling upon entering the voltage region. The method concludes by generating an output signal. The method generates a high output signal if the input signal is within the voltage region and in the first state. The method generates a low output signal if the input signal is within the voltage region and in the second state.

Technical advantages of the present invention include a system that reduces the propagation delay of a digital signal through a slew-rate limited node. The system allows operation of a switch-mode convertor containing a slew-rate limited node in the gate drive path at higher frequencies than otherwise allowed by prior efforts to minimize delays through the slew-rate limited node. The system further allows the successful transmission of short-duration pulses through a slew-rate limited node, thereby minimizing pulse skipping in a switch-mode convertor which contains a slew-rate limited node in the gate drive path. The system allows the continued application of older generation controller ICs in modern switch-mode power supplies which operate at higher frequencies and over wider ranges of load currents.

BRIEF DESCRIPTION OF THE DRAWINGS

For a more complete understanding of the present invention and its advantages, reference is now made to the following description taken in conjunction with the accompanying drawings in which like reference numbers indicate like features and wherein.

DETAILED DESCRIPTION OF THE INVENTION

Figure 1:
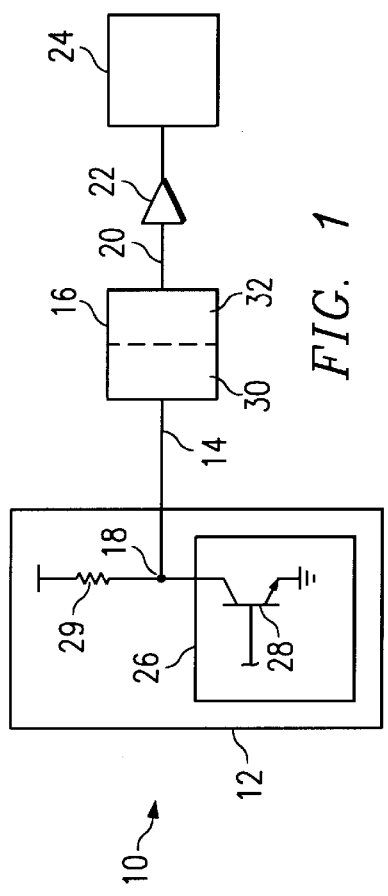
FIG. 1 illustrates a block diagram of a gate driver system in accordance with the present invention.

FIG. 1 illustrates a gate driver system 10 that includes a signal generator 12 which generates a slowly-slewing signal 14. A signal conditioner 16 couples to signal generator 12 at a node 18 to receive slowly-slewing signal 14, and produces rapidly-slewing signal 20 with minimal propagation delay. A gate driver 22 has an input coupled to signal 20 produced by signal conditioner 16, and an output coupled to a load 24. In general, signal conditioner 16 converts signal 14 into signal 20 to reduce the propagation delay from signal generator 12 to load 24.

In one embodiment, signal generator 12 may comprise a controller integrated circuit 26 (controller IC) having an output circuit 28, such as an NPN transistor, for generating signal 14. Signal generator 12 also contains a resistor 29 which couples to the collector terminal of the NPN transistor. Resistor 29 in combination with parasitic capacitances associated with the NPN transistor at node 18 limit the rise time of signal 14. The relatively slow operation of controller IC 26 also limits the fall time of signal 14. The propagation of signal 14 through slew-rate limited node 18 causes undesirably long propagation delays for system 10.

Signal conditioner 16 includes a threshold circuit 30 and an output circuit 32. Threshold circuit 30 may comprise a network of comparators and memory devices that receive signal 14 and compare it with specified voltage thresholds to generate intermediate control signals. Output circuit 32 may comprise logic units that generate signal 20 in response to the intermediate control signals. Gate driver 22 comprises any suitable gate driver circuit that receives rapidly-slewing signal 20 and, in response, outputs a high voltage/high current signal to load 24. Load 24 comprises a power transistor, such as a metal-oxide semiconductor field effect transistor (MOSFET), a bipolar junction transistor (BJT), a silicon controlled rectifier (SCR), an insulated gate field effect transistor (IGFET), or other suitable load.

Although the description of the present invention focuses primarily upon its operation with gate driver system 10, it should be understood that the present invention may operate with other applications that require rapid propagation of a slowly-slewing digital signal. Furthermore, although the system of the present invention is described with reference to reducing the propagation delays of a voltage signal that is slew-rate limited due to capacitances, it may also operate to reduce the propagation delays of a current that is slew-rate limited due to inductances. Moreover, the system of the present invention may reduce the propagation delay of any signal that experiences slew-rate limiting while carrying information through a mechanical, thermal, hydraulic, or pneumatic system.

In operation, signal generator 12 generates signal 14 having large rise and fall times. Signal conditioner 16 converts signal 14 into signal 20 by comparing signal 14 with a low voltage threshold $V_L$ and a high voltage threshold $V_H$, wherein $V_H > V_L$. Signal conditioner 16 employs a memory device to determine whether signal 14 is rising or falling upon crossing either threshold $V_L$ or $V_H$. Signal 20 exhibits small rise and fall times and minimal propagation delays. Gate driver 22 receives signal 20 and, in response, provides sufficient current to load 24 to slew its associated gate capacitance quickly. Supplying gate driver 22 with signal 20 reduces the overall propagation delay of system 10.

In prior art gate driver systems, without signal conditioner 16, even if gate driver 22 could generate enough current to accelerate the switching rate of load 24, system 10 still experienced large overall propagation delays because the large rise and fall times of signal 14 produced correspondingly large propagation delays from signal generator 12 to load 24. Signal conditioner 16 reduces these prohibitive propagation delays by generating an associated signal 20, having small rise and fall times and minimal propagation delays. By providing signal 20 to gate driver 22, signal conditioner 16 reduces the propagation delay from signal generator 12 to load 24.

Figure 2:
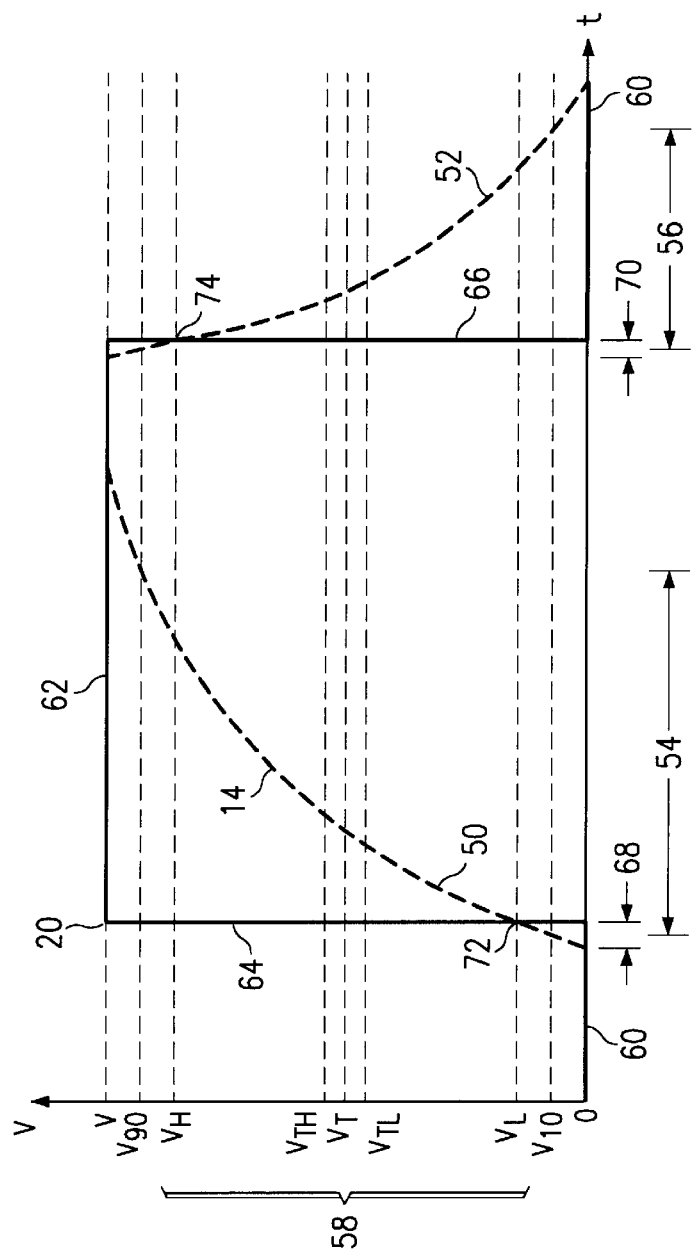
FIG. 2 illustrates signals generated by the system.

FIG. 2 illustrates signals 14 and 20 as a function of time. Signal 14 exhibits slow rising and falling edges 50 and 52, resulting in rise and fall times 54 and 56. Rise time 54 represents the time required for signal 14 to rise from near the low state supply voltage, such as 10% of the high state supply voltage, $V_{10}$, to near the high state supply voltage, such as 90% of the high state supply voltage, $V_{90}$. Fall time 56 represents the time required for signal 14 to fall from $V_{90}$ to $V_{10}$. Signal conditioner 16 converts signal 14 into signal 20 by comparing signal 14 with voltage thresholds $V_L$ and $V_H$, and by employing a memory device to determine whether signal 14 is rising or falling upon entering a voltage region 58. $V_L$ and $V_H$ define the inclusive boundaries of voltage region 58 between $V_L$ and $V_H$. In particular, threshold circuit 30 of signal conditioner 18 receives signal 14 and compares signal 14 with voltage thresholds $V_L$ and $V_H$. A memory flag is cleared when signal 14 crosses $V_L$, and the memory flag is set when signal 14 crosses $V_H$. Signal 14 is rising upon entering voltage region 58 if the memory flag is clear, and it is falling upon entering voltage region 58 if the memory flag is set.

When signal 14 is less than $V_L$, output circuit 32 generates signal 20 with a low output state 60. When signal 14 enters region 58 and it is rising, as illustrated at 72, output circuit 32 generates signal 20 with a high output state 62 and the memory flag is cleared. While signal 14 is within voltage region 58 and the memory flag is clear, output circuit 32 generates signal 20 with high output state 62. When signal 14 is greater than $V_H$, output circuit 32 generates signal 20 with high output state 62.

When signal 14 enters voltage region 58 and it is falling, as illustrated at 74, output circuit 32 generates signal 20 with low output state 60 and the memory flag is set. While signal 14 is within voltage region 58 and the memory flag is set, output circuit 32 generates signal 20 with low output state 60. Output states 60 and 62 may be adjusted to any two distinct desired reference voltages.

Propagation delay 68 from rising edge 50 of signal 14 to rising edge 64 of signal 20 and propagation delay 70 from falling edge 52 of signal 14 to falling edge 66 of signal 20 are minimized by the proper selection of thresholds $V_L$ and $V_H$. For example, decreasing threshold $V_L$ may decrease propagation delay 68, while increasing threshold $V_H$ may decrease propagation delay 70. Voltage thresholds $V_H$ and $V_L$ are established to reduce delays 68 and 70 while simultaneously providing sufficient noise margins around reference voltages V and ground to determine the state of signal 14 accurately. Although FIG. 2 illustrates $V_H$ less than $V_{90}$ and $V_L$ greater than $V_{10}$, the optimal choices for $V_H$ and $V_L$ may result in their being less than, equal to, or greater than voltages $V_{90}$ and $V_{10}$.

System 10 also facilitates the passage of a digital signal having short-duration pulses through a slew-rate limited node. For example, if signal 14 rises from zero across $V_L$ and immediately thereafter falls below $V_L$, then signal conditioner 16 generates signal 20 having high output state 62 followed by low output state 60. Similarly, if signal 14 falls from the high state supply voltage below $V_H$ and immediately thereafter rises above $V_H$, then signal conditioner 16 generates signal 20 having low output state 60 followed by high output state 62. The successful transmission of signal 14 having short-duration pulses through slew-rate limited node 18 minimizes pulse skipping in a switch-mode converter containing a slew-rate limited node in the gate drive path.

Figure 3:
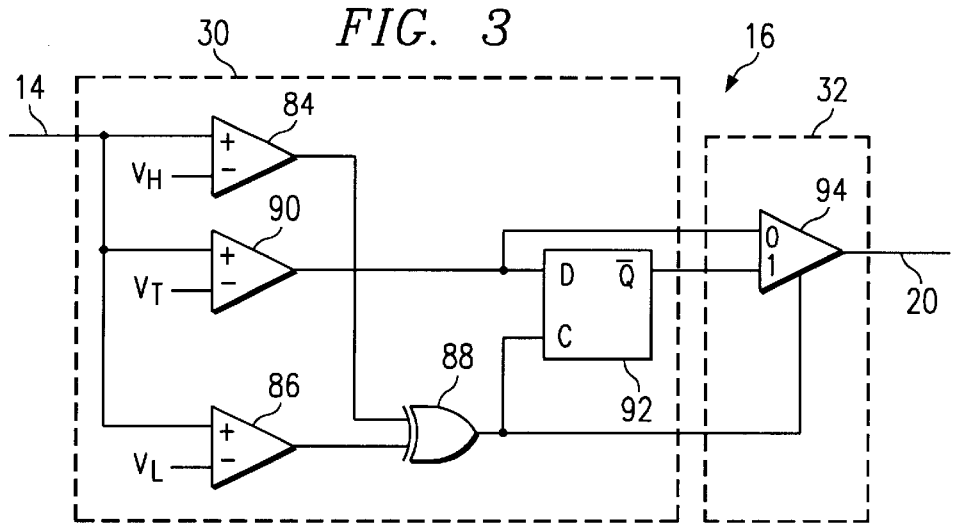
FIG. 3 illustrates one embodiment of a signal conditioner for the system.

FIG. 3 illustrates one embodiment of signal conditioner 16 for propagating signal 14 through slew-rate limited node 18. Signal conditioner 16 includes threshold circuit 30 coupled to output circuit 32. Threshold circuit 30 includes a first voltage region comparator 84 associated with a high voltage threshold $V_H$, a second voltage region comparator 86 associated with a low voltage threshold $V_L$, and a logic unit 88 coupled to comparators 84 and 86. Threshold circuit 30 also includes a voltage threshold comparator 90 associated with an intermediate voltage threshold $V_T$, and a memory device 92 coupled to logic unit 88 and comparator 90. Memory device 92 may comprise a flip-flop circuit having a data input terminal D, a clock input terminal C, and a complementary output terminal $\overline{Q}$. In one embodiment, comparator 90 has an intermediate high voltage threshold $V_T$ and an intermediate low voltage threshold $V_{TL}$, wherein $V_H > V_{TH} > V_T > V_L$. These additional voltage thresholds provide a noise margin around voltage threshold $V_T$ to determine the state of signals 14 and 20 accurately.

Output circuit 32 includes a logic circuit 94 coupled to logic unit 88, comparator 90, and memory device 92. Logic circuit 94 may comprise a suitable configuration of logic elements that receives two input signals and a select signal and generates signal 20 equal to the first input signal when the select signal is high, and the second input signal when the select signal is low.

In operation, comparators 84 and 86 determine whether signal 14 has entered voltage region 58. Comparator 90 simultaneously compares signal 14 with $V_T$. Upon entering voltage region 58, a clocking signal triggers memory device 92 at clock input terminal C. In response, memory device 92 records whether signal 14 is rising or falling upon entering voltage region 58 by determining whether signal 14 is above or below $V_T$. In particular, if signal 14 is below $V_T$ upon entering voltage region 58, memory device 92 is cleared to indicate that signal 14 is rising. If signal 14 is above $V_T$ upon entering voltage region 58, memory device 92 is set to indicate that signal 14 is falling. Logic circuit 94 generates signal 20 having high state 62 when signal 14 is within voltage region 58 and memory device 92 is cleared, and when signal 14 is greater than $V_H$. Logic circuit 94 generates signal 20 having low state 60 when signal 14 is within voltage region 58 and memory device 92 is set, and when signal 14 is less than $V_L$.

Figure 4:
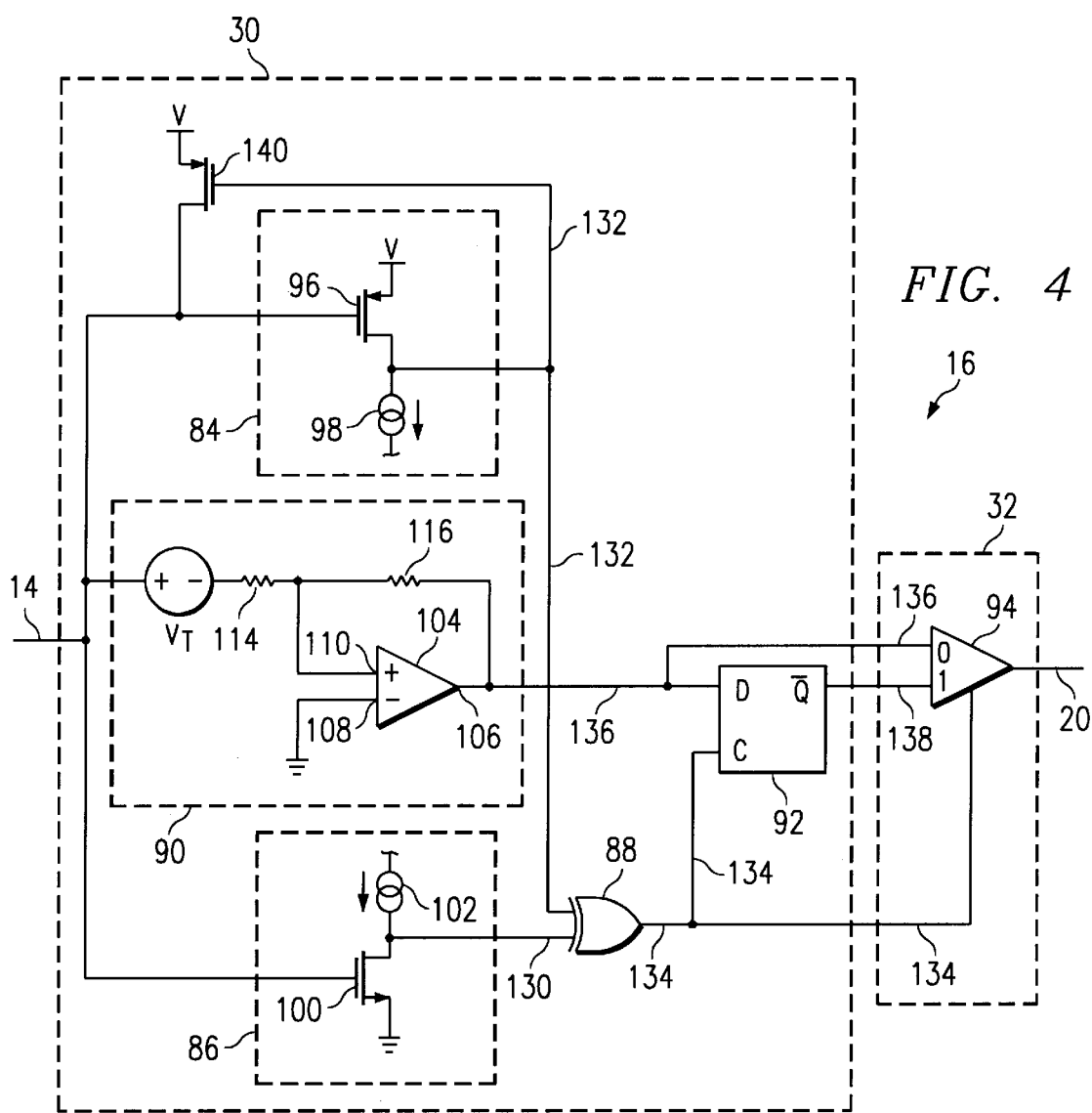
FIG. 4 illustrates, in more detail, the signal conditioner.

FIG. 4 illustrates, in more detail, signal conditioner 16. In this embodiment, comparator 84 may comprise a comparator transistor 96, such as a p-channel MOSFET, having a gate terminal coupled to signal 14, a source terminal coupled to a reference voltage (V), a drain terminal coupled to a current source 98, and a threshold voltage equal to $V_H$–V. Comparator 86 may comprise a comparator transistor 100, such as an n-channel MOSFET, having a gate terminal coupled to signal 14, a source terminal coupled to a reference voltage, such as ground, a drain terminal coupled to a current source 102, and a threshold voltage equal to $V_L$. Logic unit 88 may comprise any suitable configuration of logic elements that perform an exclusive-or function upon two input signals.

Comparator 90 may comprise a Schmitt trigger circuit, such as an operational amplifier 104 having an output terminal 106, a negative input terminal 108 coupled to a reference voltage, such as ground, and a positive input terminal 110 coupled to a reference voltage, such as intermediate voltage threshold $V_T$, and signal 14 by a resistor 114, and output terminal 106 by a resistor 116. The value of resistor 114 in relation to the value of resistor 116 determines intermediate low voltage threshold, $V_{TL}$, and intermediate high voltage threshold, $V_{TH}$, at which Schmitt trigger circuit 90 will trigger. Voltage thresholds $V_{TH}$ and $V_{TH}$ provide a noise margin around voltage threshold $V_T$ to determine the state of signals 14 and 20 accurately. It should be understood that comparator 90 may comprise any Schmitt trigger circuit configuration that exhibits a suitable hysteresis.

The operation of signal conditioner 16 is best described with reference to FIG. 2. Signal conditioner 16 receives signal 14 exhibiting rising and falling edges 50 and 52, rise time 54 and fall time 56. If rising edge 50 is less than $V_L$, transistor 100 remains off and generates a logic signal 130 that is high. Simultaneously, transistor 96 turns on and generates a logic signal 132 that is also high. Logic unit 88 performs an exclusive-or logic function upon signals 130 and 132 to produce a voltage region signal 134 that is low. Schmitt trigger circuit 90 generates a voltage threshold signal 136 that is low in response to signal 14 being less than $V_{TH}$. The flip-flop signal 138 of memory device 92 may be either high or low, depending upon the previous operation of signal conditioner 16. Logic circuit 94 receives signals 134, 136, and 138 and generates signal 20 equal to signal 136 when the state of signal 134 is low, and signal 20 equal to signal 138 when the state of signal 134 is high. In this case, logic circuit 94 generates signal 20 equal to signal 136 that is low, in response to signal 134 that is low.

As rising edge 50 of signal 14 passes voltage threshold $V_L$, transistor 100 turns on and generates logic signal 130 that is low. Simultaneously, transistor 96 remains on and generates logic signal 132 that is high. Logic unit 88 performs an exclusive-or logic function upon signals 130 and 132 to generate voltage region signal 134 that is high. Memory device 92 captures the state of signal 136 in response to a clocking signal at clock input terminal C, at the moment the state of signal 134 transitions from low to high. As a result, memory device 92 captures the low state of voltage threshold signal 136 and generates flip-flop signal 138 at complementary output terminal $\overline{Q}$ that is high. Logic circuit 94 receives signals 134, 136, and 138 and generates signal 20 equal to signal 138 that is high, in response to the high state of signal 134. Signal 20 exhibits a sharply rising edge 64. Since threshold $V_L$ may be set arbitrarily near ground, propagation delay 68 from the initiation of rising edge 50 to the initiation of rising edge 64 may be reduced to a very small value.

As rising edge 50 of signal 14 passes voltage threshold $V_{TH}$, Schmitt trigger circuit 90 generates signal 136 that is high. The noise margin between $V_T$ and $V_{TH}$ provides an accurate state determination for signal 14 despite potential oscillations of signal 14 around voltage threshold $V_T$ due to ambient noise. Transistor 100 remains on and generates signal 130 that is low while transistor 96 remains on and generates signal 132 that is high. Logic unit 88 performs an exclusive-or logic function upon signals 130 and 132 to generate signal 134 that is high. Memory device 92 generates signal 138 that is high. Logic circuit 94 receives signals 134, 136, and 138, and generates signal 20 equal to signal 138 that is high, in response to the high state of signal 134.

As rising edge 50 of signal 14 passes voltage threshold $V_H$, transistor 100 remains on and generates signal 130 that is low. Simultaneously, transistor 96 turns off and generates signal 132 that is low. Logic unit 88 performs an exclusive-or logic function upon signals 130 and 132 to generate signal 134 that is low. Memory device 92 generates signal 138 that is high. Schmitt trigger circuit 90 generates signal 136 that is high. Logic circuit 94 receives signals 134, 136, and 138 and generates a signal 20 equal to signal 136 that is high, in response to the low state of signal 134. Signal 20 remains high while rising edge 50 of signal 14 approaches voltage V and during falling edge 52 of signal 14 as it approaches voltage threshold $V_H$ from voltage V.

As falling edge 52 of signal 14 passes voltage threshold $V_H$, transistor 100 remains on and generates signal 130 that is low. Simultaneously, transistor 96 turns on and generates signal 132 that is high. Logic unit 88 performs an exclusive-or logic function upon signals 130 and 132 to generate signal 134 that is high. Memory device 92 captures the state of signal 136 in response to a clocking signal at clock input terminal C, at the moment the state of signal 134 transitions from low to high. As a result, memory device 92 captures the high state of signal 136 and generates signal 138 at complementary output terminal $\overline{Q}$ that is low. Logic circuit 94 receives signals 134, 136, and 138 and generates signal 20 equal to signal 138 that is low, in response to the high state of signal 134. Signal 20 exhibits a sharply falling edge 66. Since threshold $V_H$ may be set arbitrarily near voltage V, propagation delay 70 from the initiation of falling edge 52 to the initiation of falling edge 66 may be reduced to a very small value.

As falling edge 52 of signal 14 passes voltage threshold $V_{TL}$, Schmitt trigger circuit 90 generates signal 136 that is low. The noise margin between $V_T$ and $V_{TL}$ provides an accurate state determination for signal 14 despite potential oscillations of signal 14 around voltage threshold $V_T$ due to ambient noise. Transistor 100 remains on and generates signal 130 that is low while transistor 96 remains on and generates signal 132 that is high. Logic unit 88 performs an exclusive-or logic function upon signals 130 and 132 to generate signal 134 that is high. Memory device 92 produces signal 138 that is low. Logic circuit 94 receives signals 134, 136, and 138, and generates signal 20 equal to signal 138 that is low, in response to the high state of signal 134.

As falling edge 52 of signal 14 passes voltage threshold $V_L$, transistor 100 turns off and generates signal 130 that is high. Simultaneously, transistor 96 remains on and generates signal 132 that is high. Logic unit 88 performs an exclusive-or logic function upon signals 130 and 132 to generate signal 134 that is low. Schmitt trigger circuit 90 generates signal 136 that is low, while memory device 92 generates signal 138 that is low. Logic circuit 94 receives signals 134, 136, and 138 and generates signal 20 equal to signal 136 that is low in response to the low state of signal 134. Signal 20 remains at a low state as falling edge 52 of signal 14 approaches ground, and, thereafter, while rising edge 50 of signal 14 again approaches voltage threshold $V_L$.

In one embodiment, threshold circuit 30 further includes pull-up transistor 140, such as a p-channel MOSFET, having a source terminal coupled to a reference voltage V, a gate terminal coupled to the drain terminal of transistor 96, and a drain terminal coupled to signal 14. Transistor 140 provides an accurate state determination of signal 14 as slowly-rising edge 50 of signal 14 crosses voltage threshold $V_H$. In particular, as rising edge 50 of signal 14 crosses voltage threshold $V_H$, transistor 96 turns off and generates signal 132 that is low. In response to the low state of logic signal 132, transistor 140 turns on and "pulls up" input signal 14 to reference voltage V. This eliminates any potential oscillations of signal 14 around voltage threshold $V_H$ which may cause an inaccurate state determination of signals 14 and 20.

For example, an oscillation of rising edge 50 of signal 14 around voltage threshold $V_H$ may cause a glitch in output signal 20. In particular, if ambient noise causes rising edge 50 of signal 14 to oscillate around voltage threshold $V_H$ after crossing voltage threshold $V_H$, signal conditioner 16 may generate signal 20 that is low and immediately thereafter generate signal 20 that is high. However, the added transistor 140 pulls signal 14 to a high state after rising edge 50 of signal 14 crosses voltage threshold $V_H$. This reduces the effects of any potential oscillations of signal 14 due to noise and produces an accurate state determination for both signals 14 and 20. Threshold circuit 30 may similarly include a pull-down transistor that eliminates any potential oscillations of signal 14 around voltage threshold $V_L$.

Figure 5:
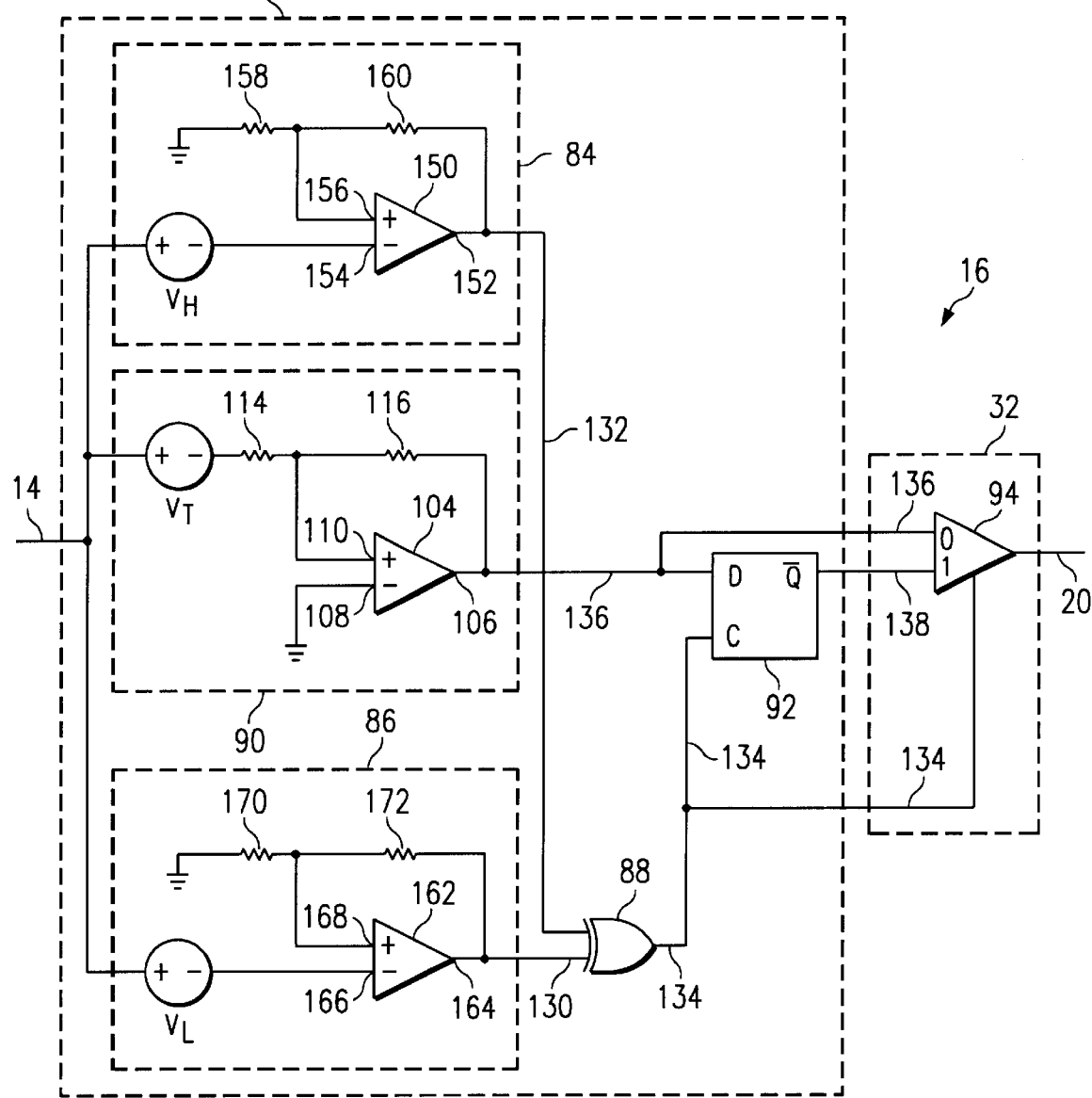
FIG. 5 illustrates another embodiment of the signal conditioner.

FIG. 5 illustrates another embodiment of signal conditioner 16. In this embodiment, comparator 84 includes a Schmitt trigger circuit, such as an operational amplifier 150 having an output terminal 152, a negative input terminal 154 coupled to a reference voltage, such as voltage threshold $V_H$, and signal 14, and a positive input terminal 156 coupled to a reference voltage, such as ground, by a resistor 158, and output terminal 152 by a resistor 160. The value of resistor 158 in relation to the value of resistor 160 determines a high plus voltage threshold $V_{H+}$, and a high minus voltage threshold $V_{H-}$, at which Schmitt trigger circuit 84 will trigger. Schmitt trigger circuit 84 triggers from a high state to a low state when a rising signal 14 crosses high plus voltage threshold $V_{H+}$, and triggers from a low state to a high state when a falling signal 14 crosses high minus voltage threshold $V_{H-}$, wherein $V_{H+}>V_H>V_{H-}$.

Comparator 86 includes a Schmitt trigger circuit, such as an operational amplifier 162 having an output terminal 164, a negative input terminal 166 coupled to a reference voltage, such as voltage threshold $V_L$, and signal 14, and a positive input terminal 168 coupled to a reference voltage, such as ground, by a resistor 170, and output terminal 164 by a resistor 172. The value of resistor 170 in relation to the value of resistor 172 determines a low plus voltage threshold $V_{L+}$, and a low minus voltage threshold $V_{L-}$, at which Schmitt trigger circuit 86 will trigger. Schmitt trigger circuit 86 triggers from a high state to a low state when a rising signal 14 crosses low plus voltage threshold $V_{L+}$, and triggers from a low state to a high state when a falling signal 14 crosses low minus voltage threshold $V_{L-}$, wherein $V_{L+}>V_L>V_{L-}$. Adding hysteresis to thresholds $V_L$ and $V_H$ prevents noise within signal 14 from causing spurious transitions in signal 20 around voltage thresholds $V_L$ and $V_H$. It should be understood that comparators 84 and 86 may comprise any Schmitt trigger circuit configurations that exhibit a suitable hysteresis. In particular, comparators 84 and 86 may both comprise non-inverting Schmitt trigger circuits or may both comprise inverting Schmitt trigger circuits.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A system for propagating a digital signal, comprising:
   a threshold circuit comprising:
      a comparator circuit that indicates whether an input signal has entered a voltage region; and
      a memory coupled to the comparator circuit, the memory having a first state if the input signal is rising upon entering the voltage region and a second state if the input signal is falling upon entering the voltage region; and an output circuit coupled to the memory, the output circuit generating a high output signal when the input signal is within the voltage region and the memory is in the first state, the output circuit generating a low output signal when the input signal is within the voltage region and the memory is in the second state.

2. The system of claim 1, further comprising:

a signal generator coupled to the threshold circuit and generating the input signal;

a driver coupled to the output circuit and generating a driving signal in response to a selected one of the high output signal and the low output signal; and a load coupled to the driver.

3. The system of claim 1, wherein the output circuit generates a high output signal when the input signal is greater than the voltage region and to generate a low output signal when the input signal is less than the voltage region.

4. A system for propagating a digital signal comprising:

a threshold circuit comprising:

a comparator circuit that indicates whether an input signal has entered a voltage region, said comparator circuit comprising a first voltage region comparator that receives the input signal and generates a first logic signal that represents whether the input signal exceeds a high voltage threshold, a second voltage region comparator that receives the input signal and generates a second logic signal that represents whether the input signal exceeds a low voltage threshold, and a voltage threshold comparator that receives the input signal and generates a voltage threshold signal that represents whether the input signal is above or below an intermediate voltage threshold; and a memory coupled to the comparator circuits, the memory having a first state if the input signal is rising upon entering the voltage region and a second state if the input signal is falling upon entering the voltage region; and an output circuit coupled to the memory, the output circuit generating a high output signal when the input signal is within the voltage region and the memory is in the first state, the output circuit further generating a low output signal when the input signal is within the voltage region and the memory is in the second state.

5. The system of claim 4, wherein:

the first voltage region comparator comprises a Schmitt trigger circuit that generates a first logic signal having a first logic state if the input signal exceeds a high plus voltage threshold, and generates a first logic signal having a second logic state if the input signal does not exceed a high minus voltage threshold; and the second voltage region comparator comprises a Schmitt trigger circuit that generates a second logic signal having the first logic state if the input signal exceeds a low plus voltage threshold, and generates a second logic signal having the second logic state if the input signal does not exceed a low minus voltage threshold.

6. The system of claim 4, wherein the threshold circuit further comprises a logic gate that generates a voltage region signal representative of an exclusive-or logic function of the first logic signal and the second logic signal.

7. The system of claim 4, wherein:

the first voltage region comparator comprises a p-channel MOSFET having a gate terminal coupled to the input voltage signal; and the second voltage region comparator comprises an n-channel MOSFET having a gate terminal coupled to the input voltage signal.

8. The system of claim 4, wherein the voltage threshold comparator comprises a Schmitt trigger circuit that receives the input signal, generates a high voltage threshold signal if the input signal exceeds an intermediate high voltage threshold, and generates a low voltage threshold signal if the input signal does not exceed an intermediate low voltage threshold.

9. The system of claim 4, wherein the memory stores the voltage threshold signal as a selected one of the first state or the second state in response to the input signal entering the voltage region.

10. The system of claim 9, wherein the output circuit further comprises a logic unit that generates the output signal equal to the voltage threshold signal if the input signal is not within the voltage region, and generates the output signal equal to the inverse of the voltage threshold signal stored in the memory if the input signal is within the voltage region.

11. A system for propagating a digital signal comprising:

a threshold circuit comprising:

a comparator circuit that indicates whether an input signal has entered a voltage region, and memory coupled to the comparator circuits, the memory having a first state if the input signal is rising upon entering the voltage region and a second state if the input signal is falling upon entering the voltage region;

an output circuit coupled to the memory, the output circuit generating a high output signal when the input signal is within the voltage region and the memory is in the first state, the output circuit further generating a low output signal when the input signal is within the voltage region and the memory is in the second state; and a pull-up transistor having a drain terminal coupled to the comparator circuit, wherein the pull-up transistor reduces oscillations in the output signal.

12. A method for propagating a digital signal, comprising:

receiving an input signal;

determining whether the input signal is within a voltage region;

setting a memory in a first state if the input signal is rising upon entering the voltage region;

setting the memory in a second state if the input signal is falling upon entering the voltage region;

generating a high output signal if the input signal is within the voltage region and the memory is in the first state; and generating a low output signal if the input signal is within the voltage region and the memory is in the second state.

13. The method of claim 12, further comprising:

generating a high output signal if the input signal is greater than the voltage region; and generating a low output signal if the input signal is less than the voltage region.

14. The method of claim 12, wherein the step of determining whether the input signal is within a voltage region comprises:

generating a first logic signal that represents whether the input signal exceeds a high voltage threshold;

generating a second logic signal that represents whether the input signal exceeds a low voltage threshold; and generating a voltage region signal in response to the first and second logic signals.

15. The method of claim 12, wherein the steps of determining a first state and determining a second state comprise comparing the input signal with an intermediate voltage threshold.

16. The method of claim 12, wherein the steps of determining a first state and determining a second state comprise comparing the input signal with an intermediate high voltage threshold and with an intermediate low voltage threshold.

17. A method for propagating a digital signal, comprising:

receiving an input signal;

determining whether the input signal is within a voltage region by generating a first logic signal that represents whether the input signal exceeds a high voltage threshold, generating a second logic signal that represents whether the input signal exceeds a low voltage threshold, and generating a voltage region signal in response to the first and second logic signals by performing an exclusive-or logic function of the first logic signal and the second logic signal;

setting a memory in a first state if the input signal is rising upon entering the voltage region;

setting the memory in a second state if the input signal is falling upon entering the voltage region;

generating a high output signal if the input signal is within the voltage region and the memory is in the first state; and generating a low output signal if the input signal is within the voltage region and the memory is in the second state.

18. A method for propagating a digital signal, comprising:

receiving an input signal;

determining whether the input signal is within a voltage region;

setting a memory in a first state if the input signal is rising upon entering the voltage region;

setting the memory in a second state if the input signal is falling upon entering the voltage region;

generating a high output signal if the input signal is within the voltage region and the memory is in the first state; and generating a low output signal if the input signal is within the voltage region and the memory is in the second state, wherein:

the steps of setting comprise: storing a voltage threshold signal as a selected one of the first state or the second state in the memory in response to the input signal entering the voltage region; and the steps of generating comprise:

generating the output signal equal to the voltage threshold signal if the input signal is not within the voltage region; and generating the output signal equal to the inverse of the voltage threshold signal stored in the memory if the input signal is within the voltage region.

19. A gate driver system, comprising:

a signal generator that generates an input signal;

a signal conditioner coupled to the signal generator, comprising:

a p-channel MOSFET having a gate terminal coupled to the input signal, the MOSFET generating a low first logic signal if the input signal exceeds a high voltage threshold and generating a high first logic signal if the input does not exceed the high voltage threshold;

an n-channel MOSFET having a gate terminal coupled to the input signal, the MOSFET generating a low second logic signal if the input signal exceeds a high voltage threshold and generating a high second logic signal if the input does not exceed the low voltage threshold;

a first logic unit coupled to the p-channel MOSFET and the n-channel MOSFET, the first logic unit generating a voltage region signal representative of an exclusive-or function of the first logic signal and the second logic signal;

a Schmitt trigger circuit that receives the input signal, generates a high voltage threshold signal if the input signal exceeds an intermediate high voltage threshold, and generates a low voltage threshold signal if the input signal does not exceed an intermediate low voltage threshold;

a memory coupled to the logic unit and the Schmitt trigger circuit and storing the voltage threshold signal in response to a transition of the voltage region signal from a low state to a high state; and a second logic unit coupled to the first logic unit and the memory and generating an output signal equal to the voltage threshold signal if the voltage region signal is low, and equal to the inverse of the voltage threshold signal stored in the memory if the voltage region signal is high;

a driver coupled to the signal conditioner and generating a driving signal in response to the output signal; and a load coupled to the driver.

20. The gate driver system of claim 19, further comprising a pull-up transistor having a drain terminal coupled to the input signal, and a gate terminal coupled to a drain terminal of the p-channel MOSFET, wherein the pull-up transistor reduces oscillations in the output signal.

* * * * *